(12) United States Patent
Melanson et al.

(10) Patent No.: US 7,613,311 B2
(45) Date of Patent: Nov. 3, 2009

(54) DIGITAL IMPLEMENTATION OF A FOURTH ORDER LINKWITZ-RILEY NETWORK WITH A LOW CUTOFF FREQUENCY

(75) Inventors: John Melanson, Austin, TX (US); Emmanuel Marchais, Broomfield, CO (US)

(73) Assignee: Cirrus Logic, Inc, Austin, TX (US)

(*) Notice: Subject to any disclaimer, the term of this patent is extended or adjusted under 35 U.S.C. 154(b) by 1050 days.

(21) Appl. No.: 11/012,418

(22) Filed: Dec. 15, 2004

(65) Prior Publication Data

US 2006/0129256 A1 Jun. 15, 2006

(51) Int. Cl.
*H03G 5/00* (2006.01)
*G06F 17/00* (2006.01)
*H01P 5/12* (2006.01)
*H03H 7/38* (2006.01)
*H03H 7/46* (2006.01)

(52) U.S. Cl. .................... 381/99; 700/94; 333/126; 333/132; 333/129; 381/98

(58) Field of Classification Search ............ 381/99, 381/98; 700/94; 333/126, 129, 132
See application file for complete search history.

(56) References Cited
U.S. PATENT DOCUMENTS

2003/0002694 A1 1/2003 Thiele
2004/0013272 A1 1/2004 Reams
2004/0122540 A1 6/2004 Allred

OTHER PUBLICATIONS

Chinn (1986) Crossover Networks From A to Linkwitz-Riley; Audiocontrol Technical Paper 102; http://www.audiocontrol.com/techpapers/techpaper102.pdf.

*Primary Examiner*—Vivian Chin
*Assistant Examiner*—George C Monikang
(74) *Attorney, Agent, or Firm*—Law Office of Dan Shifrin, PC

(57) ABSTRACT

A simplified digital implementation of a fourth order Linkwitz-Riley crossover network is provided using approximations and transformations of the classical form. The approximation is particularly beneficial when the crossover frequency is low relative to the digital sampling rate, such as when an audio stream is split between bass and treble at about 30-300 Hz and the sampling frequency is about 100 times the cutoff frequency or higher. Rather than merely cascading two sets of second order filters, such as Butterworth filters, a fourth order transfer function is more directly implemented. Conventional transfer functions are simplified through approximations resulting in the elimination of all except one parameter, c, which is a linear function of the cutoff frequency. Additionally, multipliers are moved in line with the integrator elements. A modulator may be inserted in the processing path at the output of each integrator element if limited fixed precision of the operators is desired while maintaining high performance. A crossover of the inventive design requires a fewer number of state variables, multipliers and adders.

22 Claims, 9 Drawing Sheets zplane: Zero(o), Pole(x): Low Pass zplane: Zero(o), Pole(x): High Pass

DIGITAL IMPLEMENTATION OF A FOURTH ORDER LINKWITZ-RILEY NETWORK WITH A LOW CUTOFF FREQUENCY

TECHNICAL FIELD

The present Invention pertains generally to crossover networks and, in particular, to a simplified implementation of a digital fourth order Linkwitz-Riley network with a low cutoff frequency.

BACKGROUND ART

High quality audio speakers are typically designed to operate best over a limited range of frequencies. Consequently, crossover filters or networks have long been used in audio systems to separate the band of audio frequencies into two or more sub-bands, with each sub-band used to drive a separate speaker. Desired characteristics of crossover network include relatively flat response, rapid roll off at the cutoff frequency or frequencies, minimum phase response and a minimum number of components.

The following notation will be used herein with respect to the various equations which are presented:

$f_c$ is the cutoff frequency (Hz);
$f_s$ is the sampling rate (Hz);
$\omega_c$ is the angular cutoff frequency;
$\omega_c = 2\,Pi*f_c$ is the angular cutoff frequency in continuous time;
$\omega_c = 2\,Pi*f_c/f_s$ is the angular cutoff frequency in discrete time;
s is the s transform parameter;
z is the z transform parameter;
$z_i = 1/z$: this is implemented as a delay element in discrete time systems;
$z_I = z_i/(1-z_i)$: this is implemented as an integrator in discrete time systems.

As is known, a two-way crossover network comprises a low pass filter and a high pass filter (a network for more than two speakers would include one or more intermediate band pass filters). Numerous types of crossover networks have been developed, each with its own transfer function and resulting characteristics. Butterworth, Tchebychev and Bessel filters are among the most widely used. In addition, crossover networks may be implemented in different "orders". A first order network is relatively simple, has in-phase outputs and has a roll off of 6 dB/octave. Because there is significant output beyond the crossover frequency, the speaker drivers must be able to handle the corresponding energy.

A second order network, such as the popular Butterworth, is more complex but, as illustrated in the frequency response plots of FIGS. 1A and 1B, the low pass and high pass elements have sharper roll offs of 12 dB/octave (reducing the demand on the drivers); however, the outputs of the low pass and high pass filters are 180° out of phase, as illustrated in the phase response plots of FIGS. 1C and 1D. In the FIGs, the cutoff frequency $f_c$ is 10 Hz. The transfer functions of the low pass and high pass continuous time second order Butterworth filters are:

$$BW2\_LP = \frac{\sqrt{\omega_c^4}}{(s+(-1)^{1/4}\omega_c)(s-(-1)^{3/4}\omega_c)} \quad (1)$$

$$BW2\_HP = \frac{s^2}{(s+(-1)^{1/4}\omega_c)(s-(-1)^{3/4}\omega_c)} \quad (2)$$

As illustrated in the plots of FIGS. 2A and 2B, the low pass filter has 2 complex conjugate poles, while the high pass filter has the same poles as the low pass filter plus two zeroes at 0. A second order Linkwitz-Riley network may be designed from combining second order low pass and high pass Butterworth filters and has the following combined transfer function:

$$LR2 = \frac{s^2}{(s+(-1)^{1/4}\omega_c)(s-(-1)^{3/4}\omega_c)} + \frac{\sqrt{\omega_c^4}}{(s+(-1)^{1/4}\omega_c)(s-(-1)^{3/4}\omega_c)} \quad (3)$$

FIGS. 3A and 3B are plots of the amplitude and phase responses, respectively, of a second order Linkwitz-Riley network (showing plots of the low pass component, the high pass component and their sum), again having a cutoff frequency of 10 Hz.

A fourth order Butterworth network is still more complex and has an even sharper roll off of 24 dB/octave. This network is generally not economically feasible to implement as a passive network.

A fourth order Linkwitz-Riley network, which is typically designed from two series-connected second order Butterworth filters, retains the sharp roll off advantage of fourth order filters and has the added advantages of having a substantially flat frequency response and having outputs which are 6 dB down at the crossover frequency (instead of only 3 dB for other filters) and in-phase. A fourth order Linkwitz-Riley network may be designed by cascading two second order Linkwitz-Riley networks as follows:

$$LR4 = LR4\_HP + LR4\_LP = \frac{s^4}{(s+(-1)^{1/4}\omega_c)^2(s-(-1)^{3/4}\omega_c)^2} + \frac{\omega_c^4}{(s+(-1)^{1/4}\omega_c)^2(s-(-1)^{3/4}\omega_c)^2} \quad (4)$$

FIGS. 4A and 4B are amplitude and phase response plots of a continuous time, fourth order Linkwitz-Riley network (showing plots of the low pass component, the high pass component and their sum).

For digital audio signals, the above-described crossover networks may have digital counterparts. A particular digital implementation of a fourth order Linkwitz-Riley filter is designed as a cascade of second order filters with programmable coefficients. In order for the cutoff frequency to be selectable over a reasonable range, such as 30-300 Hz, with low distortion, the filter coefficients must have very high accuracy. FIG. 5 illustrates one stage of such a filter 100. Two such stages would be combined for the low pass section of the crossover network and two more such stages would be combined for the high pass section. The full design requires 16 state variables, 20 multipliers with 20 coefficients and 16 adders. Moreover, in some applications in which the audio stream is highly over-sampled, a first decimation stage may be required, adding to the complexity.

Consequently, a need remains for a high quality crossover network having an easily implemented design with a minimum number of operations, coefficients and state variables and which does not require a decimation stage.

SUMMARY OF THE INVENTION

The present invention provides a simplified digital implementation of a fourth order Linkwitz-Riley crossover network. The implementation is particularly beneficial when the crossover frequency is low relative to the digital sampling rate, such as when an audio stream is split between bass and treble at about 30-300 Hz and the sampling frequency is about 100 times the cutoff frequency or higher. Rather than merely cascading two sets of second order filters, such as Butterworth filters, a fourth order transfer function is more directly implemented, resulting in a fourth order Direct Form II type of filter in which delay elements have been replaced by integrators having a gain of c. Conventional transfer functions are simplified through approximation resulting in the elimination of all except the one parameter, c, which is a linear function of the cutoff frequency. Additionally, multipliers are moved in line with the integrators. A modulator may be inserted in the processing path at the output of each integrator if limited fixed precision of the operators is desired while maintaining high performance. A crossover of the inventive design requires a fewer number of state variables, multipliers and adders.

In one implementation, the crossover network of the present invention includes four integrators coupled in series. The crossover frequency of the network is dependent upon a constant c input to each integrator. The outputs of the integrators are summed with the input and the output of the summer provides both the input to the first integrator and a fourth order high pass output. The output of the last integrator provides a fourth order low pass output. A multiplier may be inserted between the output of each integrator and the summer whereby each integrator output is multiplied by a predetermined value before being summed.

The outputs of the first and second integrators may also be summed with the fourth order high pass output to provide a second order high pass output while the outputs of the second, third and fourth integrators may be summed with the fourth order low pass output to provide a second order low pass output. In this configuration, an additional set of multipliers may be inserted between the output of each integrator and the second set of summers, also to multiply each integrator output by a predetermined value.

DETAILED DESCRIPTION OF THE PREFERRED EMBODIMENT

The present invention is particularly beneficial in digital applications in which the cutoff frequency $f_c$ is substantially lower than the sampling rate $f_s$ (such as less than or equal to 1% of the sampling rate), thereby reducing the risk of unexpected artifacts in the filter response. Consequently, the present invention may be beneficially implemented in various types of digital circuits. One application is to use the present invention to generate offset tracking loops. Another, which will be described herein, is in digital audio in which a low cutoff frequency, such as between 30 Hz and 300 Hz, is well below the sampling rate.

Discrete time Butterworth filters are obtained by mapping the S-plane into the Z-plane through a bilinear transformation. The transfer functions of second order Butterworth filters are:

$$BW2\_LP = \frac{-\left(2(1+z_i)^2 \text{Cos}\left[\frac{\omega_c}{2}\right]^2 \sqrt{\text{Tan}\left[\frac{\omega_c}{2}\right]^4}\right)}{\left(-2(1+z_i^2) + 4z_i \text{Cos}[\omega_c] + \sqrt{2}(-1+z_i^2)\text{Sin}[\omega_c]\right)} \quad (5)$$

$$BW2\_HP = \frac{-\left(2(-1+z_i)^2 \text{Cos}\left[\frac{\omega_c}{2}\right]^2\right)}{\left(-2(1+z_i^2) + 4z_i \text{Cos}[\omega_c] + \sqrt{2}(-1+z_i^2)\text{Sin}[\omega_c]\right)} \quad (6)$$

Figure 1A:
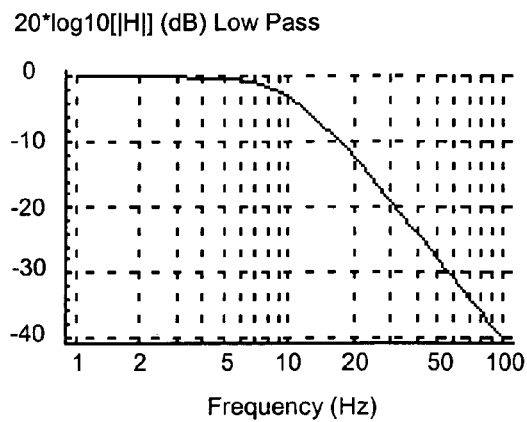
FIGS. 1A and 1B are amplitude and phase response plots, respectively, of a continuous time, second order low pass Butterworth filter.
Figure 1B:
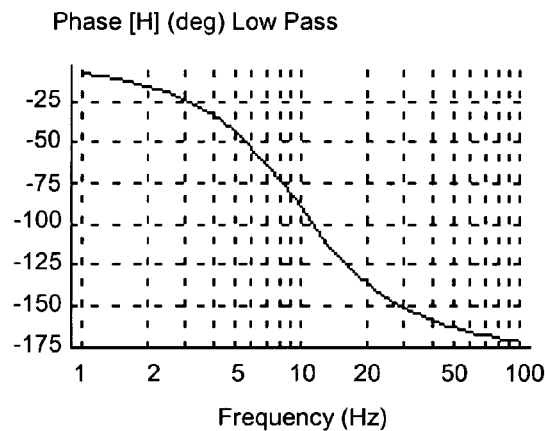
Figure 1C:
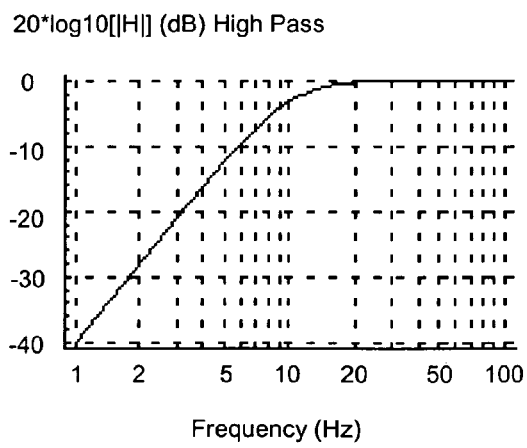
FIGS. 1C and 1D are amplitude and phase response plots, respectively, of a continuous time, second order high pass Butterworth filter.
Figure 1D:
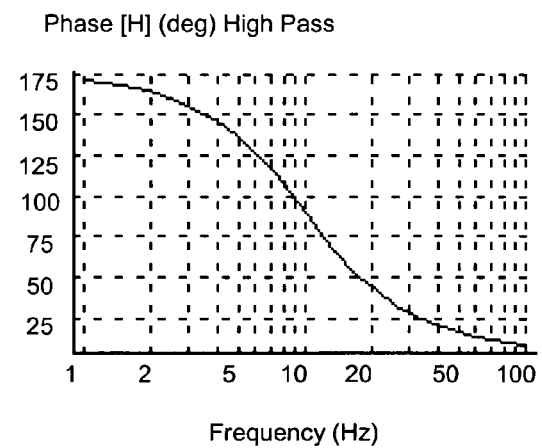
Figure 2A:
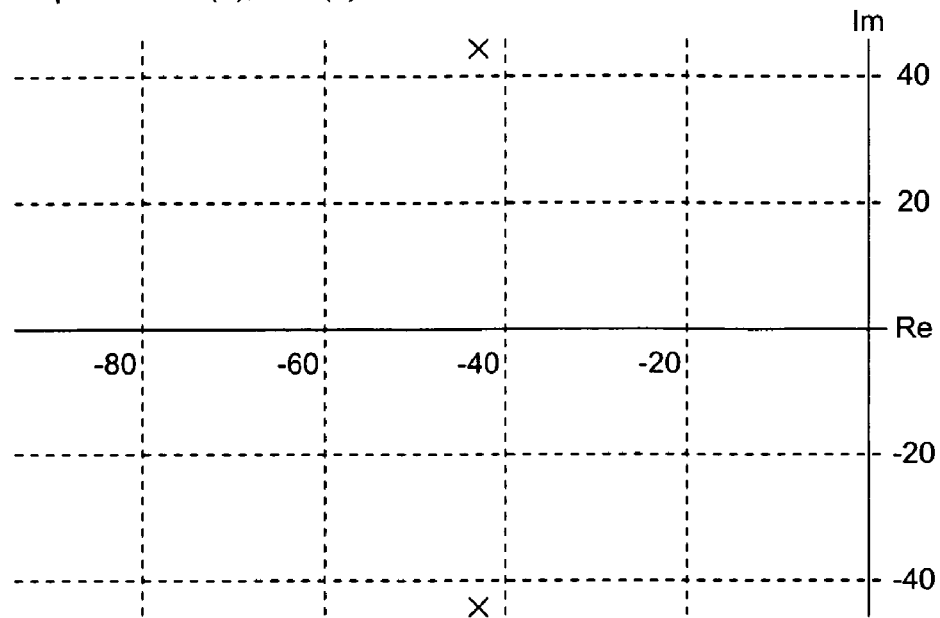
FIGS. 2A and 2B are plots of the poles and zeros of continuous time, second order low and high pass Butterworth filters, respectively.
Figure 2B:
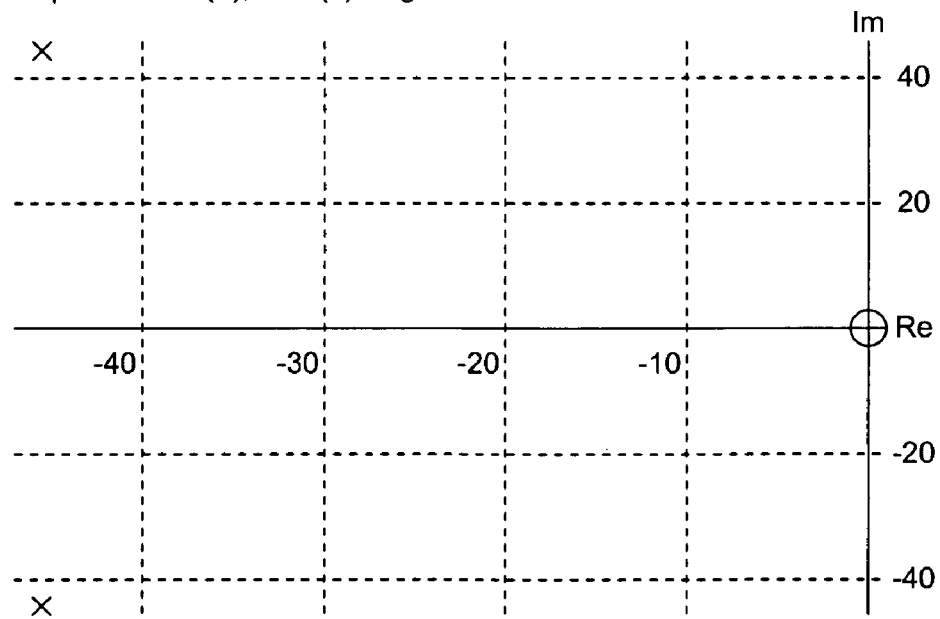
Figure 3A:
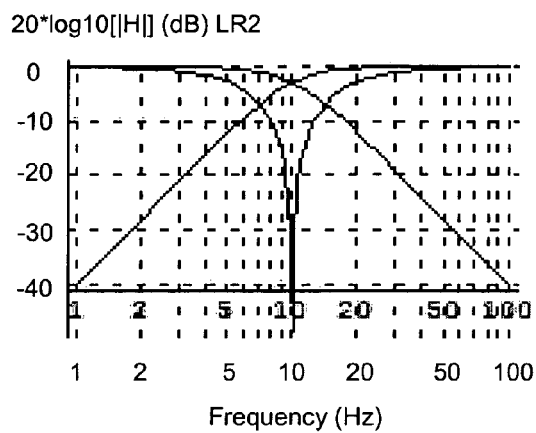
FIGS. 3A and 3B are amplitude and phase response plots, respectively, of a continuous time, second order Linkwitz-Riley filter.
Figure 3B:
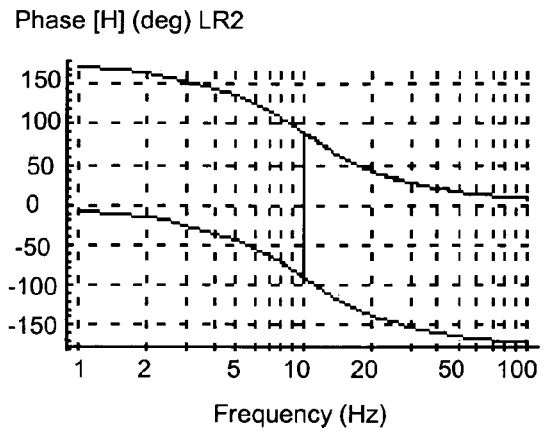
Figure 4A:
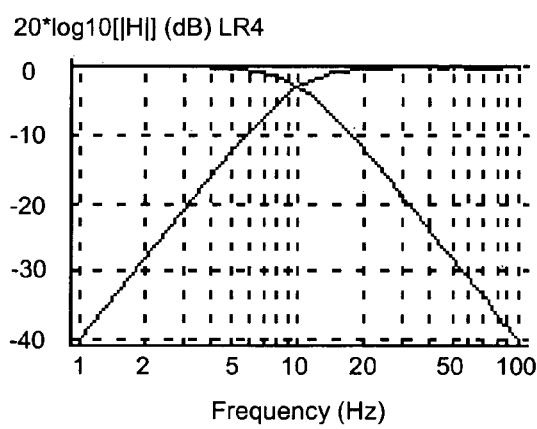
FIGS. 4A and 4B are amplitude and phase response plots, respectively, of a continuous time, fourth order Linkwitz-Riley filter.
Figure 4B:
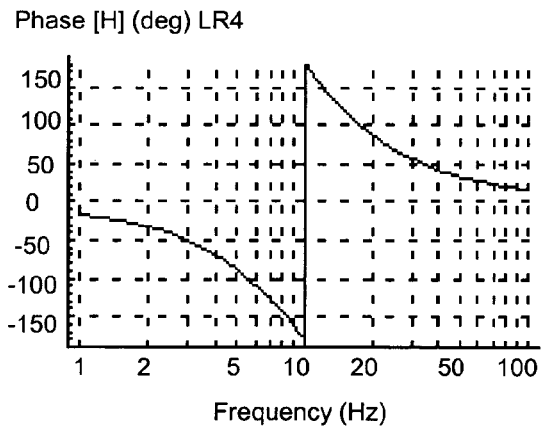
Figure 5:
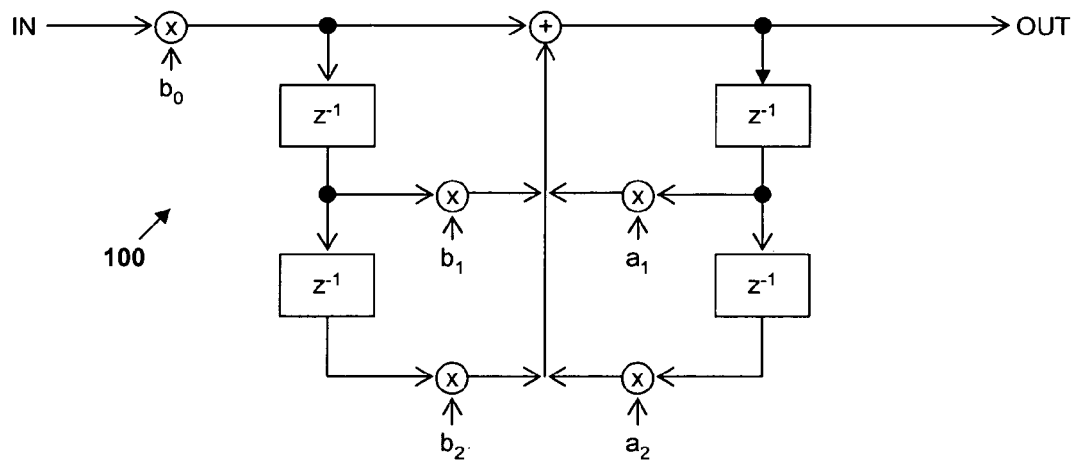
FIG. 5 illustrates one stage of a continuous time, fourth order Linkwitz-Riley filter.
Figure 6A:
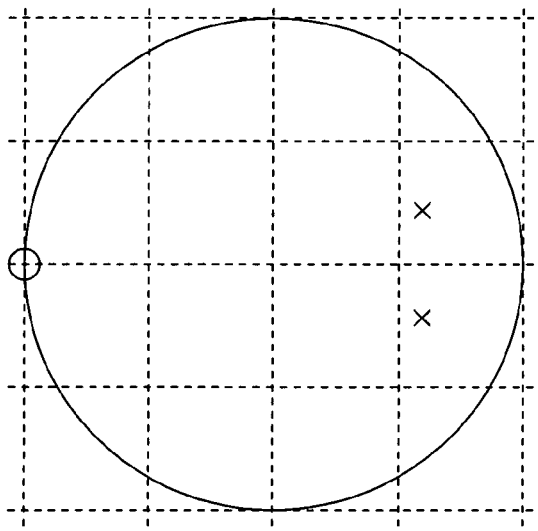
FIGS. 6A and 6B are plots of the poles and zeros of discrete time, second order low and high pass Butterworth filters, respectively.
Figure 6B:
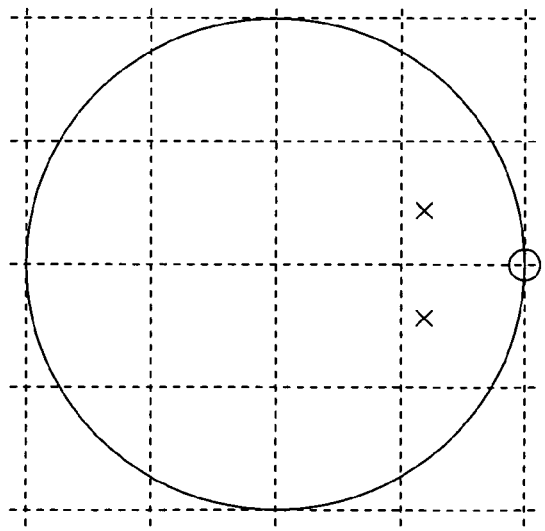
Figure 7A:
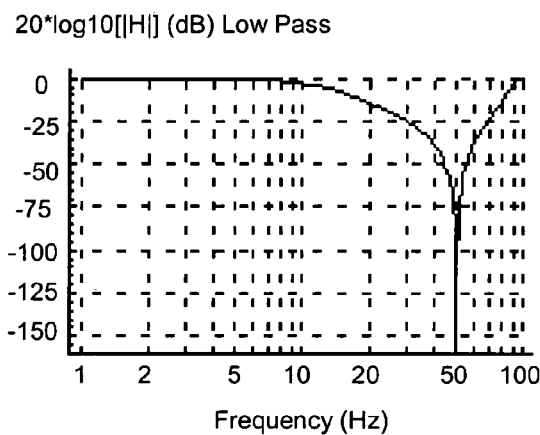
FIGS. 7A-7D are amplitude and phase response plots of discrete time, second order low and high pass Butterworth filters.
Figure 7B:
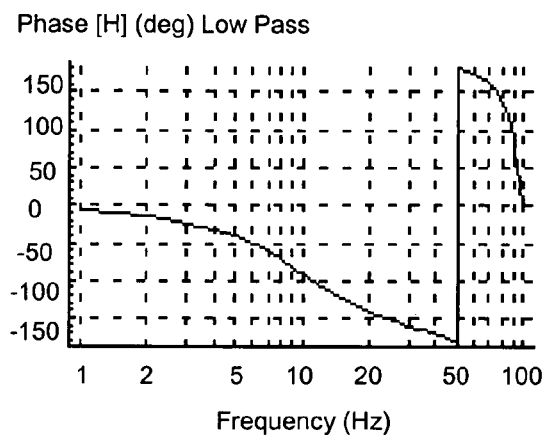
Figure 7C:
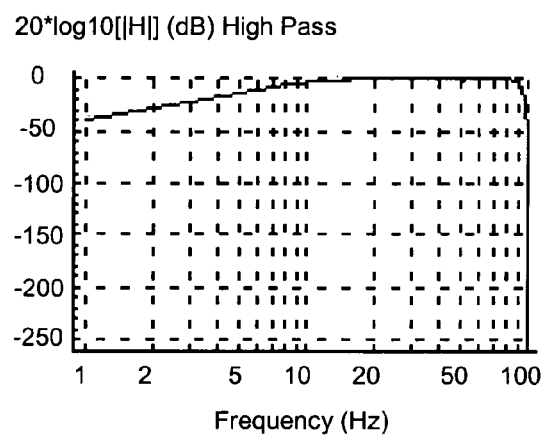
Figure 7D:
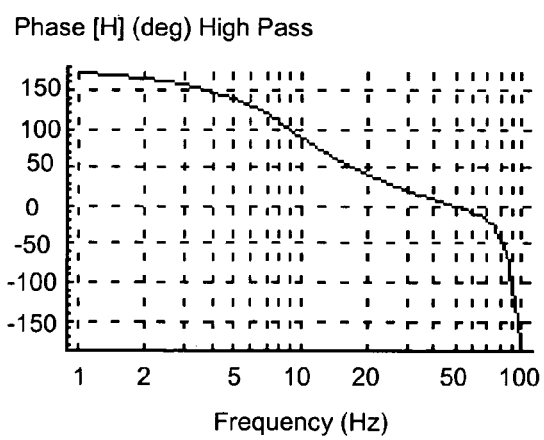

The low pass filter has two complex conjugate poles plus two zeroes at −1, while the high pass filter has the same poles as the low pass filter plus two zeroes at 1 (see FIGS. 6A and 6B). The response at the cutoff frequency is maintained by pre-warping the frequency axis (see FIGS. 7A-7D).

The discrete time Butterworth filters can be implemented in a digital system by using delay elements for the variable $z_i=1/z$. For instance a Direct Form II structure would use the coefficients of the following rational functions:

$$BW2\_LP = \frac{\left(\frac{2\cos\left[\frac{\omega_c}{2}\right]^2 \sqrt{\tan\left[\frac{\omega_c}{2}\right]^4}}{2+\sqrt{2}\sin[\omega_c]} + \frac{4z_i\cos\left[\frac{\omega_c}{2}\right]^2 \sqrt{\tan\left[\frac{\omega_c}{2}\right]^4}}{2+\sqrt{2}\sin[\omega_c]} + \frac{2z_i^2\cos\left[\frac{\omega_c}{2}\right]^2 \sqrt{\tan\left[\frac{\omega_c}{2}\right]^4}}{2+\sqrt{2}\sin[\omega_c]}\right)}{\left(1 - \frac{4z_i\cos[\omega_c]}{2+\sqrt{2}\sin[\omega_c]} + \frac{z_i^2(2-\sqrt{2}\sin[\omega_c])}{2+\sqrt{2}\sin[\omega_c]}\right)} \quad (7)$$

$$BW2\_HP = \frac{\left(\frac{2\cos\left[\frac{\omega_c}{2}\right]^2}{2+\sqrt{2}\sin[\omega_c]} - \frac{4z_i\cos\left[\frac{\omega_c}{2}\right]^2}{2+\sqrt{2}\sin[\omega_c]} + \frac{2z_i^2\cos\left[\frac{\omega_c}{2}\right]^2}{2+\sqrt{2}\sin[\omega_c]}\right)}{1 - \left(\frac{4z_i\cos[\omega_c]}{2+\sqrt{2}\sin[\omega_c]} + \frac{z_i^2(2-\sqrt{2}\sin[\omega_c])}{2+\sqrt{2}\sin[\omega_c]}\right)} \quad (8)$$

Figure 8:
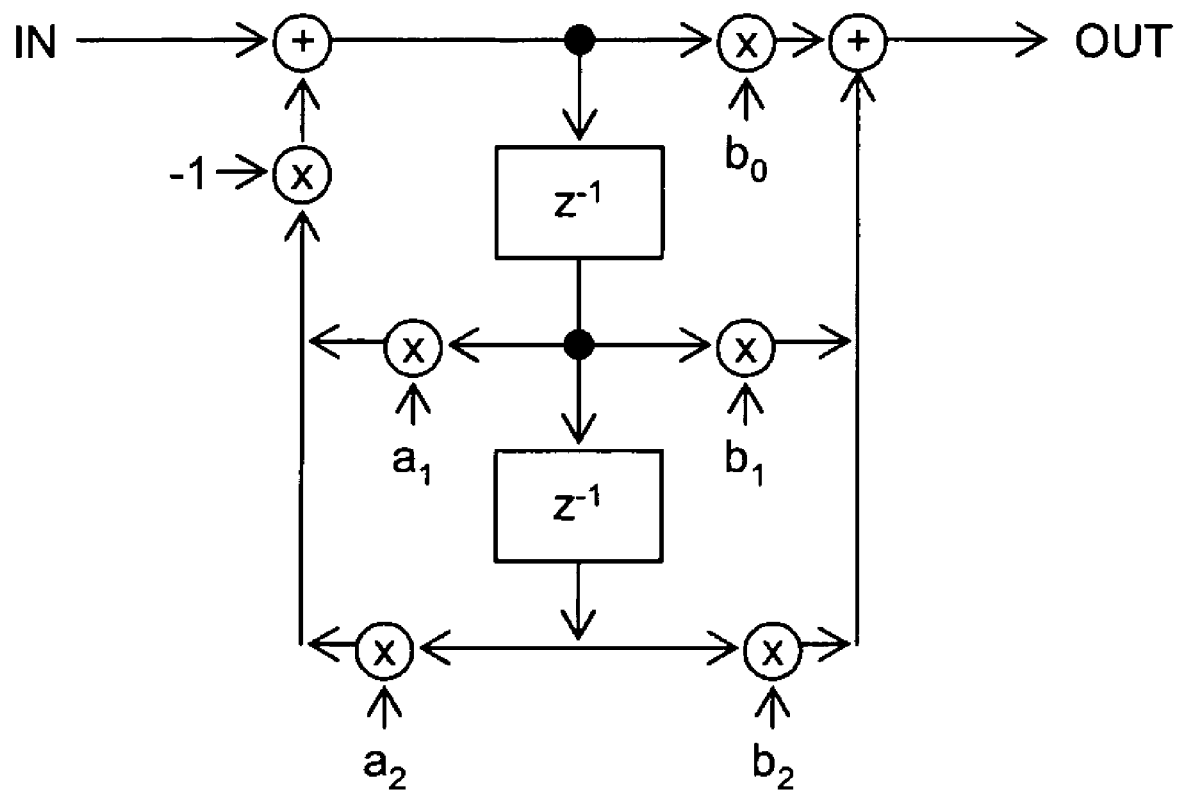
FIG. 8 is a block diagram of the Direct Form II structure of a discrete time, second order Butterworth filter.
Figure 9A:
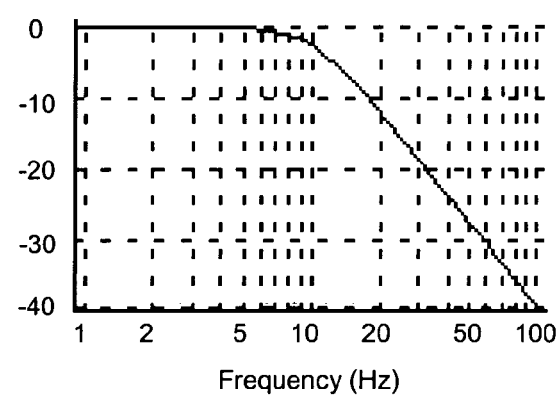
FIGS. 9A-9D are amplitude and phase response plots of discrete time, second order low and high pass Butterworth filters following two approximations.
Figure 9B:
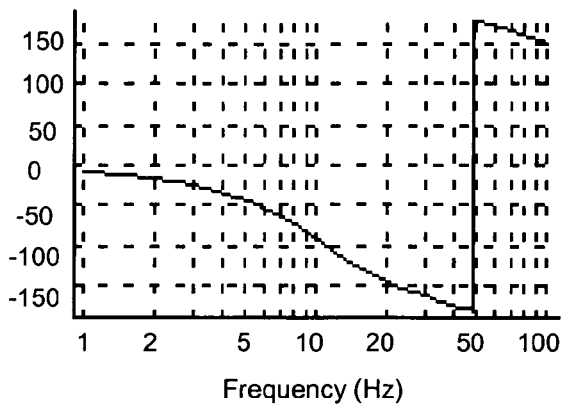
Figure 9C:
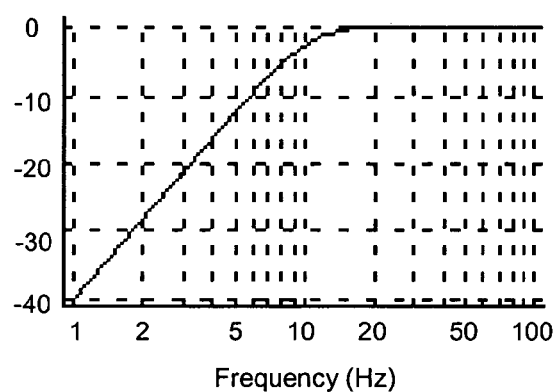
Figure 9D:
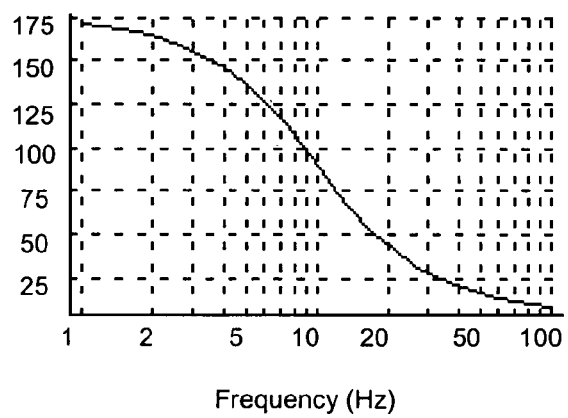

The Direct Form II filter has the structure shown in FIG. 8 in which $b_0$, $b_1$, $b_2$ are the coefficients of the numerator polynomial while $a_1$, $a_2$ are the coefficients of the denominator polynomial. These coefficients are fairly complicated. However, if the cutoff frequency of the filters is much less than the sampling rate (i.e. $f_c \ll f_s \Longleftrightarrow \omega_c \ll 2\pi$), two approximations may be made which greatly simplify the coefficients.

First, the two zeroes at −1 of the low pass filter have little effect on this filter response, because the attenuation around the Nyquist frequency is very high. Thus, the low pass filter may be safely approximated by removing two zeroes at −1 and adjusting for the gain coming from these zeroes:

$$BW2\_LP = \frac{\left(8z_i^2\cos\left[\frac{\omega_c}{2}\right]^2 \sqrt{\tan\left[\frac{\omega_c}{2}\right]^4}\right)}{\left((2+\sqrt{2}\sin[\omega_c])\right)} \left(1 - \frac{4z_i\cos[\omega_c]}{(2+\sqrt{2}\sin[\omega_c])} + \frac{z_i^2(2-\sqrt{2}\sin[\omega_c])}{(2+\sqrt{2}\sin[\omega_c])}\right) \quad (9)$$

Second, the coefficients of the Direct Form II implementation are only a function of the angular cutoff frequency $\omega_c$. If $f_c \ll f_s$, $\omega_c$ is close to 0 and the coefficients may be approximated by a second order Taylor series of $\omega_c$ around 0:

$$BW2\_LP = \left\{ \begin{array}{l} \text{poly}, z_i, \\ \left\{ \begin{array}{l} 0, \{b_0 = 0, b_1 = 0, b_2 = (\omega_c^2 + 0[\omega_c]^3)\}, \\ \left\{ \begin{array}{l} a_0 = 1, a_1 = (-2 + \sqrt{2}\,\omega_c + 0[\omega_c]^3), \\ a_2 = (1 - \sqrt{2}\,\omega_c + \omega_c^2 + 0[\omega_c]^3) \end{array} \right\} \end{array} \right\} \end{array} \right\} \quad (10)$$

$$BW2\_HP = \left\{ \begin{array}{l} \text{poly}, z_i, \\ \left\{ 0, \left\{ \begin{array}{l} b_0 = \left(1 - \frac{\omega_c}{\sqrt{2}} + \frac{\omega_c^2}{4} + 0[\omega_c]^3\right), \\ b_1 = \left(-2 + \sqrt{2}\,\omega_c - \frac{\omega_c^2}{2} + 0[\omega_c]^3\right), \\ b_2 = \left(1 - \frac{\omega_c}{\sqrt{2}} + \frac{\omega_c^2}{4} + 0[\omega_c]^3\right) \end{array} \right\} \right\}, \\ \left\{ \begin{array}{l} a_0 = (1), a_1 = (-2 + \sqrt{2}\,\omega_c + 0[\omega_c]^3), \\ a_2 = (1 - \sqrt{2}\,\omega_c + \omega_c^2 + 0[\omega_c]^3) \end{array} \right\} \end{array} \right\} \quad (11)$$

The numerator coefficients of the high pass filter can be further approximated to a $0^{th}$ order.

$$BW2\_HP = \left\{ \begin{array}{l} b_0 = (1 + 0[\omega_c]^1), \\ b_1 = (-2 + 0[\omega_c]^1), \\ b_2 = (1 + 0[\omega_c]^1) \end{array} \right\} \quad (12)$$

The following simplified transfer functions for the low pass and high pass filters may now be derived:

$$BW2\_LP = \frac{\omega_c^2 z_i^2}{1 + (-2 + \sqrt{2}\,\omega_c)z_i + (1 - \sqrt{2}\,\omega_c + \omega_c^2)z_i^2} \quad (13)$$

$$BW2\_HP = \frac{1 - 2z_i + z_i^2}{1 + (-2 + \sqrt{2}\,\omega_c)z_i + (1 - \sqrt{2}\,\omega_c + \omega_c^2)z_i^2} \quad (14)$$

These approximations create little distortion for $f_s >= 100\,f_c$. For processing a direct digital stream (DSD) (in which an audio stream is encoded using a very high sampling rate, such as 64 to 128 times the baseband rate) in an audio application, the sample rate is typically $f_s = 128*48$ KHz. The cutoff frequency of the filter to implement this value would be around 100 Hz. In this case, $f_s = 61,440\,f_c$ and the approximations work well. As an example, the low pass and high pass filter transfer functions are plotted in FIGS. 9A-9D for $f_s = 100\,f_c$.

The previous transfer functions reflect the coefficients of a Direct Form II implementation. When $f_c \ll f_s$, some variable changes may be used to simplify the transfer functions still further which results in small modifications to the filters structure. It may then be observed that the poles of the transfer functions are close to 1. A first variable change, $1/z_t = z^{-1} \Longleftrightarrow z_t = z_i/(1-z_i)$, preserves the structure and characteristics of the filters but translates the poles by −1 in the $1/z_t$ plane. In other words, in this plane, the poles are translated close to 0. The dynamic range required to implement the coefficients is dramatically reduced.

$$BW2\_LP = \frac{\omega_c^2 z_t^2}{1 + \sqrt{2}\,\omega_c z_t + \omega_c^2 z_t^2} \quad (15)$$

$$BW2\_HP = \frac{1}{1 + \sqrt{2}\,\omega_c z_t + \omega_c^2 z_t^2} \quad (16)$$

In Equations 15 and 16, $z_t = z_i/(1-z_i)$ is the transfer function of an integrator. The low pass and high pass transfer functions obtained through this variable change may thus be implemented by using a Direct Form II filter structure, replacing each delay element ($z_i$) by an integrator ($z_t$) and using the coefficients from the functions above.

With the previous structure, it is still necessary to calculate two coefficients to implement the filters: $\sqrt{2}\,\omega_c$ and $\omega_c^2$. In addition, the two coefficients have very different dynamic ranges and implementing the square root and squaring operations forces the coefficients to use high precision to avoid the distortion introduced by the coefficients' quantization. Both problems may be solved by making a second set of variable changes: $c=\sqrt{2}\omega_c$, $z_tc=cz_t$. The filter structure is somewhat changed by adding a multiplier (c, being a linear function of the angular cutoff frequency) inline with the integrators. The following transfer functions result:

$$BW2\_LP = \frac{z_t c^2}{2\left(1 + z_t c + \frac{z_t c^2}{2}\right)} \tag{17}$$

$$BW2\_HP = \frac{1}{1 + z_t c + \frac{z_t c^2}{2}} \tag{18}$$

Figure 10:
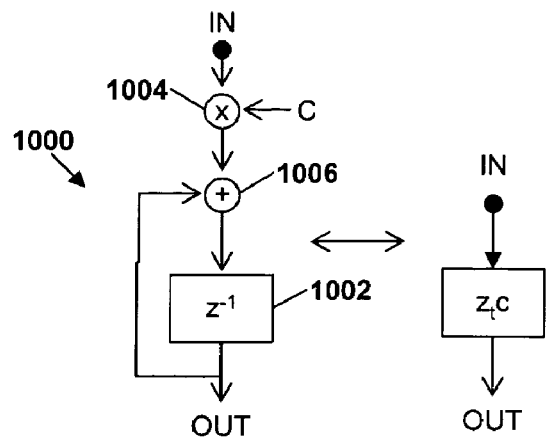
FIG. 10 is a block diagram of a mapping of Direct Form II structure of a discrete time, second order Butterworth filter in which each delay element has been replaced by a multiplier in line with an integrator.

The result is a set of Direct Form II based filters in which each delay element $z^{-1}$ has been replaced by a multiplier inline with an integrator element $z_t c$. The filter stage 1000 of FIG. 10 illustrates this replacement. In the original form, a delay register 1002 receives the input, multiplied by a coefficient c in a multiplier 1004, and its fed back output through the adder 1006. Making the variable changes has the advantage of requiring only the single coefficient c which is a linear function of the cutoff frequency, instead of the original complicated set of coefficients. Thus, the cutoff frequency is easier to tune and coefficient quantization and dynamic range issues associated with multiple coefficients are avoided. Moreover, because $\omega_c$ is assumed to be small, c is correspondingly small and little precision is required for the multipliers (fewer bits required). Beginning with a Direct Form II topology, performing the $z_t$ mapping and moving the multipliers in line with the integrator paths, the dynamic range may be kept relatively constant across the state variables and a c coefficient squaring operation may be avoided.

Assuming $f_c \ll f_s$, a discrete time second order Linkwitz-Riley network may be implemented with the previously approximated discrete time Butterworth transfer functions:

$$LR2\_HP + LR2\_LP = \frac{1}{1 + z_t c + \frac{z_t c^2}{2}} + \frac{z_t c^2}{2\left(1 + z_t c + \frac{z_t c^2}{2}\right)} \tag{19}$$

or $$\frac{LR2\_LP}{LR2\_HP} = \frac{z_t c^2}{2} \tag{20}$$

The high pass filter output has a single unity forward path. The low pass filter may easily be obtained from the high pass filter after going through two $z_t c$ elements and dividing by two. Also, the numerator and denominator coefficients are all simple powers of two and may be implemented at minimal cost in hardware.

To obtain a fourth order Linkwitz-Riley network, the previous structure may be used as a first stage to obtain the second order Linkwitz-Riley low pass and high pass filters. Two more comparable structures are then cascaded with the low pass and high pass outputs, respectively, of the first structure to obtain the fourth order low and high pass outputs. However, a simpler structure may be obtained by directly realizing a fourth order Linkwitz-Riley high pass filter from the fourth order polynomial equations, then recreating the other outputs by adding forward paths tapped from the already existing $z_t c$ elements outputs. The number of operations and the number of state variables required are both reduced. The feedback path of the structure forces the filters outputs to have four poles. In addition to providing a fourth order network, second order Linkwitz-Riley outputs may also be provided by canceling two of the poles with forward paths.

The following equations illustrate the filter coefficients from the feedback paths used to implement the fourth order Linkwitz-Riley high pass filter output and illustrate how the other outputs are obtained by adding $z_t c$ delayed versions through forward paths.

$$LR4\_HP + LR4\_LP = \tag{21}$$
$$\left(\frac{1}{1 + 2z_t c + 2z_t c^2 + z_t c^3 + \frac{z_t c^4}{4}} + \frac{z_t c^4}{4\left(1 + 2z_t c + 2z_t c^2 + z_t c^3 + \frac{z_t c^4}{4}\right)}\right)$$

where the coefficients of the feedback paths are 1, 2, 2, 1, ¼.

$$\frac{LR2\_HP}{LR4\_HP} = 1 + z_t c + \frac{z_t c^2}{2} \tag{22}$$

where the coefficients of the forward path for LR2_HP are 1, 1, ½, 0, 0.

$$\frac{LR2\_LP}{LR4\_HP} = \frac{z_t c^2}{2} + \frac{z_t c^3}{2} + \frac{z_t c^4}{4} \tag{23}$$

where the coefficients of the forward path for LR2_LP are 0, 0, ½, ½, ¼.

$$\frac{LR4\_LP}{LR4\_HP} = \frac{z_t c^4}{4} \tag{24}$$

where the coefficients of the forward path for LR4_LP are 0, 0, 0, 0, ¼.

Figure 11:
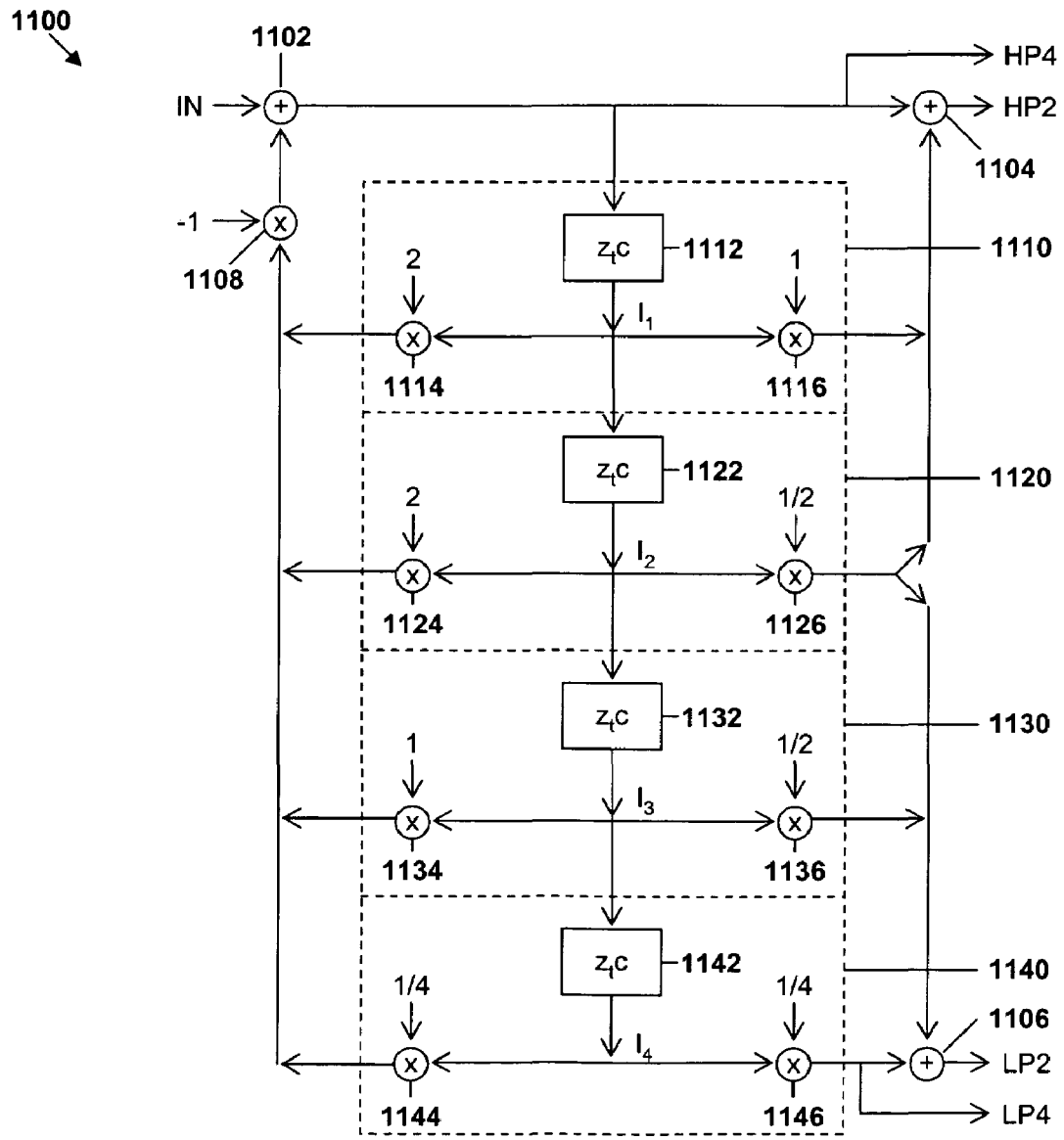
FIG. 11 is a block diagram of discrete time Linkwitz-Riley filter with both second order and fourth order high and low pass outputs.

FIG. 11 is a block diagram of an embodiment of a network or filter 1100 of the present invention in which the transfer functions of Equations 21-24 are implemented and in which the replacement illustrated in FIG. 10 has been made. The network 1100 includes a first summer 1102 coupled to receive a digital signal IN; the output of the first summer 1102 comprises the fourth order high pass filter output HP4. As used herein, the term "coupled" may refer to an indirect relationship in which two components may be separated by one or more intermediary components, whereby a signal may pass through and be processed or altered by the intermediary component(s), as well as to a direct electrical connection between two components, whereby a signal passes directly from one to the other. If second order high and low pass outputs are desired, optional second and third summers 1104, 1106 may be included in the network 1100. The second summer 1104 has an input coupled to receive the output HP4 of the first summer 1102; the output of the second summer 1104 comprises the second order high pass filter output HP2. The third summer 1106 has inputs described hereinbelow and an output which comprises the second order low pass filter output LP2. A first multiplier 1108 has an output coupled to the second input of the first adder 1102.

The network 1100 further includes four stages 1110, 1120, 1130 and 1140; a first output of each stage is received by an input (or set of inputs) of the first multiplier 1108. Second outputs of the first and second stages 1110 and 1120 are received by a second input (or set of inputs) of the second summer 1104 and second outputs of the third and fourth stages 1130 and 1140 are received by a second input (or set of inputs) of the third summer 1106. The second output of the fourth stage 1140 also comprises the fourth order low pass filter output LP4.

Each stage 1110, 1120, 1130 and 1140 includes a first integrator element $z_fc$ 1112, 1122, 1132, 1142 to receive the output from the previous stage (or, in the case of the first stage 1110, to receive the HP4 output from the first summer 1102). Each integrator element 1112, 1122, 1132, 1142 is a function of the single coefficient c. Their outputs comprise the transfer functions $I_1, I_2, I_3, I_4$ and are multiplied by a first set of values in second multipliers 1114, 1124, 1134, 1144. The outputs of the second multipliers 1114, 1124, 1134, 1144 are input into the first multiplier 1108. If the second order outputs are desired, the outputs $I_1$ and $I_2$ are also multiplied by another set of values in third multipliers 1116 and 1126 whose outputs are input into the second summer 1104 which outputs the second order high pass filter output HP2. The outputs $I_3, I_4$ are also multiplied by another set of values in third multipliers 1136, 1146 whose outputs, along with the output of the second stage multiplier 1126, are input into the third summer 1106 which outputs the second order low pass filter output LP2.

In the embodiment illustrated, the inputs to the multipliers in FIG. 11 are multiplied by:

| Multiplier Number | Value |
|---|---|
| 1108 | −1 |
| 1114 | 2 |
| 1116 | 1 |
| 1124 | 2 |
| 1126 | ½ |
| 1134 | 1 |
| 1136 | ½ |
| 1144 | ¼ |
| 1146 | ¼ |

Figure 12:
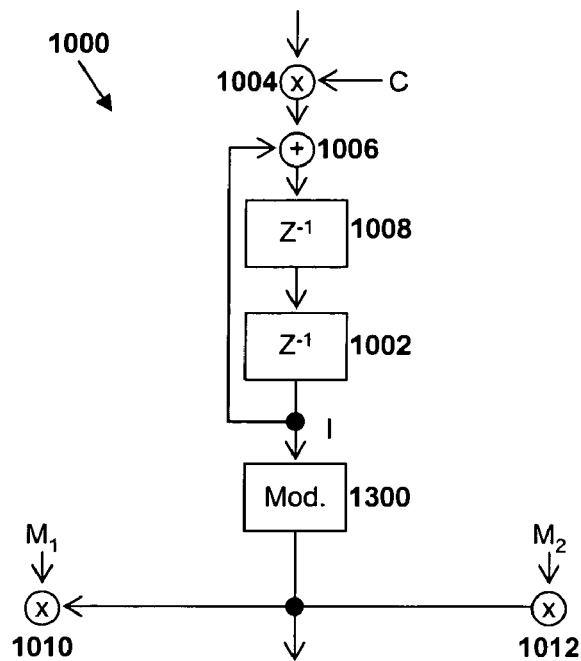
FIG. 12 is a block diagram of a modification to the network stage of FIG. 10 to accommodate a modulator.

FIG. 12 illustrates a modification of the network stage 1000 illustrated in FIG. 10, in the $z^{-1}$ form. An optional second delay $z^{-1}$ 1008 may be inserted in line between the summer 1006 and the first delay 1002 to process an interleaved two-channel (stereo) audio-stream. Multipliers 1010 and 1012 at the output of the stage 1000 scale the output for adding to the scaled outputs of the other stages, as illustrated in FIG. 11.

Figure 13:
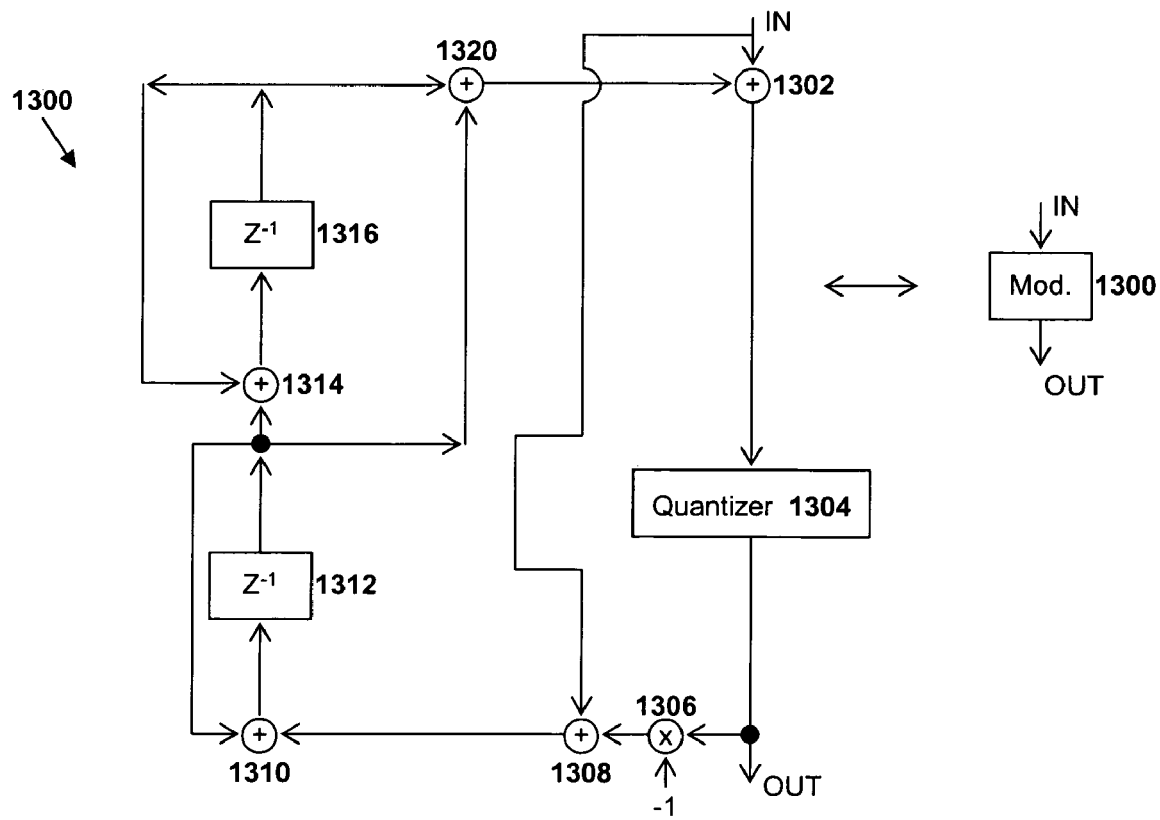
FIG. 13 is a block diagram of a second order delta-sigma modulator which may be incorporated into the filter of the present invention.

Still referring to the network stage of FIG. 12, when high performance is desired but with limited fixed precision of the integrator output multipliers 1010 and 1012, such as in a high quality audio digital-to-analog converter, a second order delta-sigma modulator 1300 may be inserted at the output I. In FIG. 11, a modulator may be inserted at the output of each integrator 1112, 1122, 1132, 1142. A modulator may be inserted whether each network stage includes a single delay or integrator (in the configuration of FIG. 11) or includes the optional second delay 1008 or integrator (in the configuration of FIG. 12). FIG. 13 is a block diagram of the modulator 1300 which is stable, easy to implement and has good noise rejection properties. The modulator 1300 preferably has a signal transfer function of 1 and a noise transfer function of $(1-z^{-1})^2$. More specifically, the modulator 1300 comprises two stages and includes a first summer 1302 having an input to receive the associated integrator output I (FIG. 12). An output of the first summer 1302 is coupled to an input of a quantizer 1304 having an output coupled to the output of the filter stage (in the illustrated example, the output of the quantizer 1304 would be coupled to the input of the second filter stage 1120 of FIG. 11 as well as to the output multiplier(s) 1114, 1116 of the first stage 1110). The output of the quantizer 1304 is coupled to an input of a multiplier 1306 having a gain of −1. The output of the multiplier 1306, as well as the input IN, are input to a second summer 1308.

The output of the second summer 1308 is coupled to an input of a third summer 1310. A first delay element 1312 is coupled to the output of the third summer 1310. The output of the first integrator 1312 is fed back to the third summer 1310 and is also coupled to inputs of fourth and fifth summers 1314, 1320. A second delay element 1316 is coupled to the output of the fourth summer 1314. The output of the second delay element 1316 is fed back to the fourth summer 1314 and is also coupled to an input of the fifth summer 1320. The output of the fifth summer 1320 is coupled to an input of the first summer 1302.

The cutoff frequency is still controllable through the use of the single coefficient c, where $c=\sqrt{2}*\omega_c=\sqrt{2}*2\pi*(f_c/f_s)$. For example, if $f_c$ is 100 Hz and $f_s$ is 128*48 KHz, c will equal $1.44\times10^{-4}$.

The objects of the invention have been fully realized through the embodiments disclosed herein. Those skilled in the art will appreciate that the various aspects of the invention may be achieved through different embodiments without departing from the essential function of the invention. The particular embodiments are illustrative and not meant to limit the scope of the invention as set forth in the following claims. Moreover, although described above with respect to an apparatus, the need in the art may also be met by a method of processing signals.

What is claimed is:

1. A digital crossover network, comprising:
a first summer having a first input coupled to a signal input, a second input, and an output, the output of the first summer providing a fourth order high pass output of the crossover network;
a first integrator element, comprising an input coupled to the output of the first summer and an output coupled to the second input of the first summer;
a second integrator element, comprising an input coupled to the output of the first integrator element and an output coupled to the second input of the first summer;
a third integrator element, comprising an input coupled to the output of the second integrator element; and an output coupled to the second input of the first summer; and
a fourth integrator element, comprising an input coupled to the output of the third integrator element and an output coupled to the second input of the first summer, the output of the fourth integrator element comprising a fourth order low pass output of the crossover network,
the crossover network having a crossover frequency dependent upon a constant c.

2. The digital crossover network of claim 1, further comprising:
- a fifth integrator element coupled between the output of the first summer and the input of the first integrator element;
- a sixth integrator element coupled between the output of the first integrator element and the input of the second integrator element;
- a seventh integrator element coupled between the output of the second integrator element and the input of the third integrator element; and
- an eighth integrator element coupled between the output of the third integrator element and the input of the fourth integrator element;
- whereby an interleaved, two-channel audio steam is accommodated.

3. The digital crossover network of claim 1, further comprising:
- a first multiplier coupled between the output of the first integrator element and the second input of the first summer and having an input to receive a first value;
- a second multiplier coupled between the output of the second integrator element and the second input of the first summer and having an input to receive a second value;
- a third multiplier coupled between the output of the third integrator element and the second input of the first summer and having an input to receive a third value; and
- a fourth multiplier coupled between the output of the fourth integrator element and the second input of the first summer and having an input to receive a fourth value.

4. The digital crossover network of claim 3, wherein:
the first value is −2;
the second value is −2;
the third value is −1; and
the fourth value is −¼.

5. The digital crossover network of claim 3, further comprising a fifth multiplier coupled between the second input of the first summer and the outputs of the first, second, third and fourth multipliers and having an input to receive a fifth value.

6. The digital crossover network of claim 5, wherein:
the first value is 2; the second value is 2;
the third value is 1;
the fourth value is ¼; and
the fifth value is −1.

7. The digital crossover network of claim 1, wherein the fourth integrator element further comprises a sixth multiplier coupled between the output of the fourth integrator element and the fourth order low pass output and having an input coupled to receive a sixth value.

8. The digital crossover network of claim 7, wherein the sixth value is ¼.

9. The digital crossover network of claim 1, further comprising a delta-sigma modulator coupled after the output of each integrator element.

10. The digital crossover network of claim 1, further comprising:
- a second summer having:
  - a first input coupled to the output of the first summer;
  - a second input coupled to the output of the first and second integrator elements; and
  - an output providing a second order high pass output of the crossover network; and
- a third summer having:
  - an input coupled to the output of the second, third and fourth integrator elements; and
  - an output providing a second order low pass output of the crossover network.

11. The digital crossover network of claim 10, further comprising:
- a seventh multiplier coupled between the output of the first integrator element and the second input of the second summer and having an input to receive a seventh value;
- an eighth multiplier coupled between the output of the second integrator element and the second inputs of the second and third summers and having an input to receive an eighth value;
- a ninth multiplier coupled between the output of the third integrator element and the second input of the third summer and having an input to receive a third ninth; and
- a tenth multiplier coupled between the output of the fourth integrator element and the second input of the third summer and having an input to receive a tenth value.

12. The digital crossover network of claim 11, wherein:
the seventh value is 1;
the eighth value is ½;
the ninth value ½; and
the tenth value ¼.

13. A digital crossover network for an audio system, comprising:
- a first summer having a first input coupled to an audio input, a second input, and an output providing a high pass output of the crossover network;
- a first stage, comprising:
  - a first integrator element having an input coupled to the output of the first summer and an output;
  - a second integrator element having an input coupled to the output of the first integrator element and an output; and
  - a first multiplier having a first input coupled to the output of the second integrator element, a second input to receive a first value, and an output coupled to the second input of first summer;
- a second stage, comprising:
  - a third integrator element having an input coupled to the output of the second integrator element and an output;
  - a fourth integrator element having an input coupled to the output of the third integrator element and an output; and
  - a third multiplier having a first input coupled to the output of the fourth integrator element, a second input to receive a second value, and an output coupled to the second input of first summer;
- a third stage, comprising:
  - a fifth integrator element having an input coupled to the output of the fourth integrator element and an output;
  - a sixth integrator element having an input coupled to the output of the fifth integrator element and an output; and
  - a third multiplier having a first input coupled to the output of the sixth integrator element, a second input to receive a third value, and an output coupled to the second input of first summer; and
- a fourth stage, comprising:
  - a seventh integrator element having an input coupled to the output of the sixth integrator element and an output;
  - an eighth integrator element having an input coupled to the output of the seventh integrator element and an output; and
  - an fourth multiplier having a first input coupled to the output of the eighth integrator element, a second input to receive a fourth value, and an output coupled to the second input of first summer; and a fifth multiplier having a first input coupled to the output of the eighth integrator element, a second input coupled to receive a fifth value, and an output providing a fourth order low pass output of the crossover network, the crossover network having a crossover frequency dependent upon a constant c input to each of the first through eighth integrator elements.

14. The digital crossover network of claim 13, wherein:
the first stage further comprises a first modulator coupled between the output of the second integrator element and the second input of the first summer;
the second stage further comprises a second modulator coupled between the output of the fourth integrator element and the second input of the first summer;
the third stage further comprises a third modulator coupled between the output of the sixth integrator element and the second input of the first summer; and
the fourth stage further comprises a fourth modulator coupled between the output of the eighth integrator element and the second input of the first summer.

15. The digital crossover network of claim 13, wherein:
the first value is $-2$;
the second value is $-2$;
the third value is $-1$;
the fourth value is $-\frac{1}{4}$; and
the fifth value is $\frac{1}{4}$.

16. The digital crossover network of claim 13, further comprising:
a second summer having a first input coupled to the output of the first summer, a second input, and an output providing a second order high pass output of the crossover network;
a third summer having a first input coupled to the output of the fifth multiplier, a second input, and an output providing a second order low pass output of the crossover network;
the first stage further comprising a sixth multiplier having a first input coupled to the output of the second integrator element, a second input to receive a sixth value, and an output coupled to the second input of second summer;
the second stage further comprising an seventh multiplier having a first input coupled to the output of the fourth integrator element, a second input to receive a seventh value, and an output coupled to the second input of second and third summers;
the third stage further comprising a eighth multiplier having a first input coupled to the output of the sixth integrator element, a second input to receive an eighth value, and an output coupled to the second input of third summer; and
wherein the output of the fifth multiplier is coupled to the input of the third summer.

17. The digital crossover network of claim 16, wherein:
the sixth value input to the tenth multiplier is 2;
the seventh value input to the eleventh multiplier is 2;
and the eighth value input to the twelfth multiplier is 1.

18. A digital implementation of a 4th order Linkwitz-Riley filter, comprising:
a primary high pass output having a transfer function $HP4=1/[1+2z_t c+2z_t c^2+z_t c^3+(z_t c^4/4)]$; and
a primary low pass output having a transfer function $LP4=z_t c^4/\{4*[1+2z_t c+2z_t c^2+z_t c^3+(z_t c^4/4)]\}$;
where: $z_t$ is obtained by mapping $1/z_t=z^{-1}<=>z_t=z_t/(1-z_t)$; and
c is a linear function of the angular cutoff frequency $\omega_c$ of the filter, wherein the cutoff frequency is substantially lower than a sampling frequency of the filter.

19. The filter of claim 18, further comprising:
a secondary high pass output having a transfer function $HP2=\sqrt{(HP4)}$; and
a secondary low pass output having a transfer function $LP2=\sqrt{LP4}$.

20. The filter of claim 18, further comprising:
a first integrator element coupled to an digital input stream and having an output having a transfer function $I_1=HP_4*z_t c$;
a second integrator element coupled to the output of the first integrator element and having an output having a transfer function $I_2=HP_4*z_t c^2$;
a third integrator element coupled to the output of the second integrator element and having an output having a transfer function $I_3=HP4*z_t c^3$; and
a fourth integrator element coupled to the output of the third integrator element and having an output having a transfer function $I_4=HP4*z_t c^4$;
wherein:
$HP4=IN-(2*I_1+2*I_2+I_3+LP4)$; and
$LP4=I_4/4$.

21. The filter of claim 20, wherein:
the secondary high pass output has a transfer function $HP2=HP4+I_1+I_2/2$; and
the secondary low pass output has a transfer function $LP2=LP4+I_2/2+I_3/2$.

22. The filter of claim 20, further comprising first, second, third and fourth modulators coupled to the outputs of the first, second, third and fourth integrator elements, respectively.

* * * * *